United States Patent
Inaba

(10) Patent No.: US 7,125,779 B2
(45) Date of Patent: Oct. 24, 2006

(54) SEMICONDUCTOR DEVICE AND METHOD OF MANUFACTURING THE SAME

(75) Inventor: Satoshi Inaba, Peekskill, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 10/911,596

(22) Filed: Aug. 5, 2004

(65) Prior Publication Data

US 2005/0009256 A1 Jan. 13, 2005

Related U.S. Application Data

(62) Division of application No. 09/977,933, filed on Oct. 17, 2001, now Pat. No. 6,828,203, which is a division of application No. 09/235,310, filed on Jan. 22, 1999, now Pat. No. 6,329,258.

(30) Foreign Application Priority Data

Jan. 23, 1998 (JP) ................... 10-011164

(51) Int. Cl.
*H01L 21/336* (2006.01)

(52) U.S. Cl. ...................... 438/305; 438/589

(58) Field of Classification Search ................ 438/305, 438/301, 303, 589, 270
See application file for complete search history.

(56) References Cited

U.S. PATENT DOCUMENTS

| | | |
|---|---|---|
| 3,851,379 A | 12/1974 | Gutknecht et al. |
| 4,939,100 A | 7/1990 | Jeuch et al. |
| 5,079,180 A | 1/1992 | Rodder et al. |
| 5,342,796 A | 8/1994 | Ahn et al. |
| 5,362,663 A | 11/1994 | Bronner et al. |
| 5,448,094 A * | 9/1995 | Hsu ............................ 257/330 |
| 5,583,064 A | 12/1996 | Lee et al. |
| 5,789,266 A | 8/1998 | Son |
| 5,877,048 A | 3/1999 | Wu |

(Continued)

FOREIGN PATENT DOCUMENTS

JP 2-110973 4/1990

(Continued)

OTHER PUBLICATIONS

Shin'ichiro Kimura et al., "Short-Channel-Effect-Suppressed sub-0.1-um Grooved-Gate MOSFET's with Gate," IEEE Trans. Electron Devices, vol. 42, No. 1, Jan. 1995, pp. 94-100.

*Primary Examiner*—Michael Trinh
(74) *Attorney, Agent, or Firm*—Pillsbury Winthrop Shaw Pittman, LLP

(57) ABSTRACT

There is provided a MISFET which suppresses a short-channel effect in a deep submicron region and has a low parasitic resistance, a low parasitic capacitance, and a small drain junction leakage current. A shallow concave is formed in a channel forming portion and an extension region forming portion of a MISFET, shallow ion implantation for forming an extension region is performed to a bottom surface of the shallow concave. Deep ion implantation for forming a source/drain region is performed to a silicon substrate adjacent to the concave, and the position of a peak concentration of the shallow ion implantation is caused to coincide with the position of a peak concentration of the deep ion implantation, so that a MISFET which suppresses a short-channel effect and has a low source/drain parasitic resistance, a low source/drain parasitic capacitance, and a small drain junction leakage current generated by SALICIDE steps can be provided. The MISFET according to the invention is preferably used as a means for providing a semiconductor substrate constituted by a high-speed CMOS circuit having a high integration level at a high yield and high reliability.

6 Claims, 6 Drawing Sheets

U.S. PATENT DOCUMENTS 5,953,605 A 9/1999 Kodama
6,130,454 A * 10/2000 Gardner et al. ............. 257/330

FOREIGN PATENT DOCUMENTS

| JP | 02-126681 | 5/1990 |
| JP | 04-093080 | 3/1992 |
| JP | 5-67785 | 3/1993 |
| JP | 05-283422 | 10/1993 |
| JP | 06-061487 | 3/1994 |
| JP | 07-106557 | 4/1995 |

* cited by examiner

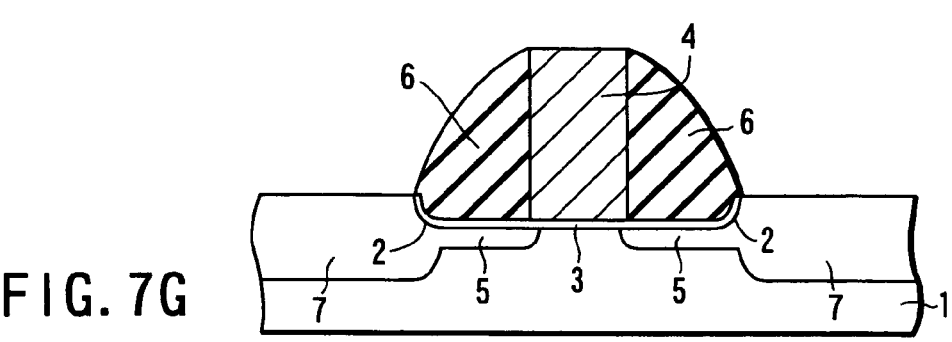
FIG. 7F
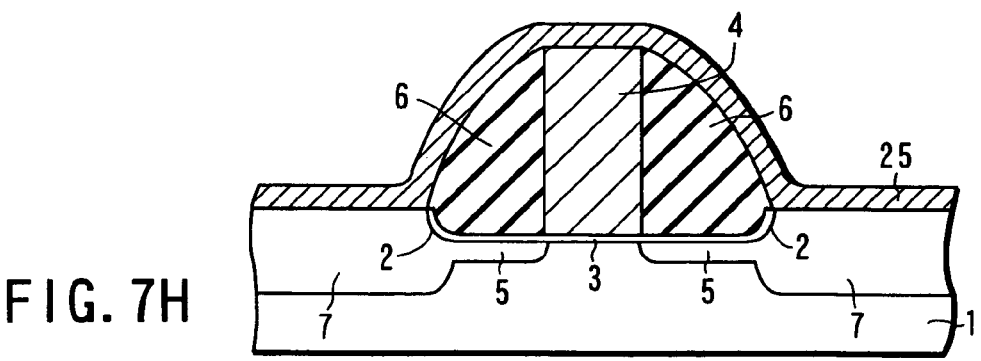
FIG. 7G
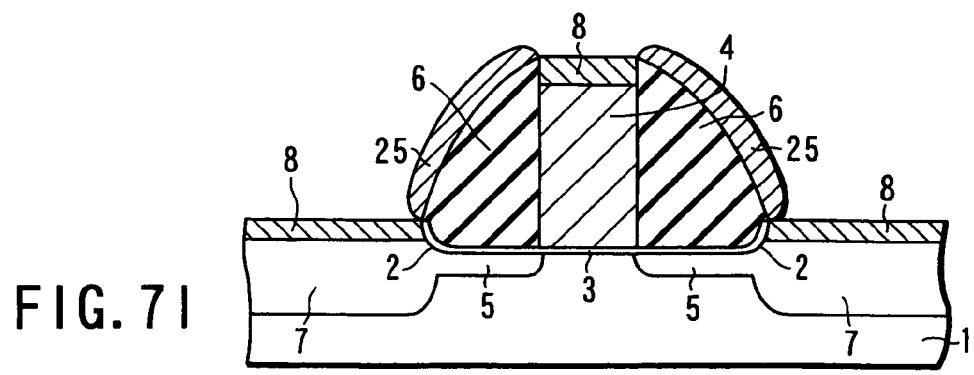
FIG. 7H
FIG. 7I

SEMICONDUCTOR DEVICE AND METHOD OF MANUFACTURING THE SAME

CROSS-REFERENCE TO RELATED APPLICATIONS

This is a Divisional Application of U.S. patent application Ser. No. 09/977,933, filed Oct. 17, 2001, now U.S. Pat. No. 6,828,203 B1, which is a Divisional of U.S. patent application Ser. No. 09/235,310, filed Jan. 22, 1999, now U.S. Pat. No. 6,329,258 B1, both of which are based upon and claims the benefit of priority from prior Japanese Patent Application No. 10-011164, filed Jan. 23, 1998, the entire contents of all of which are incorporated herein by reference.

BACKGROUND OF THE INVENTION

The present invention relates to the structure of a semiconductor device and a method of manufacturing the same and, more particularly, to an element structure of a Metal Insulator-Semiconductor Field Effect Transistor (to be referred to as a MISFET hereinafter) which is excellent in a high-speed operation and a method of manufacturing the same.

As conventional semiconductor devices using MISFETs, memory devices such as dynamic RAMS or static RAMS formed on silicon substrates, processors using CMOS logic circuits, and the like are mass-produced.

In order to improve the integration density or performance of such a semiconductor device, miniaturization of a MISFET serving as a component is a necessary condition, and development of miniaturization technique and necessity of a short-channel effect and parasitic resistance suppression of the MISFET increase together with transition of generation of a semiconductor device.

As a method of suppressing a short-channel effect, for example, a Lightly Doped Drain structure (to be referred to as an LDD structure hereinafter) shown in FIG. 1 is known. In a MISFET having the LDD structure, a polysilicon gate 4 is formed on a semiconductor substrate through a gate oxide film 3, and ion implantation is performed by using the polysilicon gate 4 as a mask, so that shallow impurity diffusion layers 5 are formed on both the sides of the polysilicon gate 4 to be adjacent to a channel region formed at the gate electrode 4. In addition, gate sidewall spacers 6 are formed on the source/drain sides of the polysilicon gate 4, and ion implantation is performed by using the gate sidewall spacers 6 and the polysilicon gate 4 as masks, so that deep impurity diffusion layers are formed.

Since the impurity diffusion layers are used as source/drain regions 7 for supplying a drive current of a MISFET, voltage drop is increased by the resistances in the impurity diffusion layers. For this reason, the impurity concentration of this portion must be as high as possible. In order to form a diffusion layer having a high impurity concentration by ion implantation, an amount of implanted impurity per unit area (to be referred to as a dose amount hereinafter) must be increased, and an acceleration voltage of ion implantation must be increased.

When the acceleration voltage of impurity ions is increased, the depth of ion implantation increased. For this reason, deep impurity diffusion layers are generally formed in the source/drain regions 7. When a gate length decreases with miniaturization of the MISFET, the decrease in distance between the source/drain regions adversely affects the threshold voltage of the MISFET and considerably degrades cut-off characteristics of the MISFET.

In order to activate the ion-implanted impurity, a high-temperature heat treatment must be performed. However, at this time, since the impurity is also laterally diffused, the distance between the source/drain regions in which the impurity is deeply implanted more decreases, and it is difficult to suppress the off-leakage current. The changes in characteristics with miniaturization of the MISFET are generally called a short-channel effect.

In order to reduce the short-channel effect in the LDD structure, shallow diffusion layers are formed to be adjacent to both the sides of the polysilicon gate 4, and the off-leakage current is suppressed such that the distance between the deep diffused layers of the source/drain regions 7 is as large as possible even if the length of the polysilicon gate 4 decreases. Shallow diffusion layers 5 shown in FIG. 1 are called source/drain extension regions.

In order to reduce the resistances of the source/drain regions 7 and the resistance of the polysilicon gate 4, as shown in FIG. 1, a low-resistance layer constituted by a silicide of high melting point metal 8 is formed on the source/drain regions 7 and the polysilicon gate 4. Since the silicide of high melting point metal 8 is formed in a self-aligned manner, the structure of the high-speed MISFET is called as a SALICIDE (abbreviation of self-aligned silicide) structure.

In order to improve the performance of the MISFET in a deep submicron region, a gate length must be decreased, and the dimension of depth must also be scaled down in proportion. Therefore, when the short-channel effect is to be reduced in the LDD structure, the shallow extension regions 5 must be formed, and at the same time, the source/drain regions 7 must be made shallow. However, since in general, high impurity concentration layer can not be made shallow, the shallowness of the ion implantation is limited to a predetermined level.

In the SALICIDE structure, as indicated by a broken-line circle in FIG. 1, the junction of the extension region 5 becomes close to the end portion of the silicide layer 8 on the drain side, and the formation of the silicide layer 8 on the drain region tend to cause increase a leakage current of a drain junction. The increase in leakage current especially poses a problems at the drain junction to which a large voltage is applied in operation of the MISFET. When an integrated circuit having a high integration level is constituted by CMOS circuits of low power dissipation, it is a necessary condition to remove the leakage current of constituent MISFETs.

In order to avoid the problem of the above LDD structure, an elevated source/drain structure shown in FIG. 2 is proposed. In this structure, silicon epitaxial layers 51 are grown on source/drain regions, and ions are implanted into source/drain diffusion layers by using gate sidewall spacers 6 and a polysilicon gate 4 as masks. At this time, since the ion implantation is performed through silicon epitaxial layers 51, the depth of the source/drain regions 7 from the interface of epitaxial layer and silicon substrate 1 is small to suppress a short-channel effect.

However, in the elevated source/drain structure, selective epitaxial growth of silicon at a high temperature of 800° C. or higher is additionally performed, and the number of processing steps increases. At the same time, extra diffusion of impurity implanted in a channel region for threshold voltage control and in the extension regions is advanced. Therefore, this technique cannot always obtain a preferable result as a production technique for a deep submicron region.

Therefore, a means for realizing the structure of a new MISFET having the same advantages as those of an elevated source/drain structure without high-temperature heat treatment processing is strongly demanded.

As shown in FIG. 2, in the elevated source/drain structure, when the silicon epitaxial layers 51 are formed on a silicon substrate leaving (100) surface, (311) facets are easily generated opposite to the polysilicon gate 4, and parasitic capacitance is formed between the silicide layer 8 and the polysilicon gate 4. The gate-drain parasitic capacitance disadvantageously degrades the high frequency performance. Here, the facet indicates a small crystal surface having a special crystal orientation.

As another structure for suppressing a short-channel effect, a UMOS structure (to be described below) is known. That is, as shown in FIG. 3, a U-shaped deep trench is formed in a semiconductor substrate 1, source/drain regions 62 and extension regions 61 are formed on the surface of the silicon substrate.

In this UMOS structure, a channel region and a gate insulating film 3 are formed on the inner surface of a deep trench, and a gate electrode 63 is formed to bury the trench. Since source/drain regions 7 have no surfaces which are opposed to each other inside the semiconductor substrate 1 in the structure, the structure is excellent to avoid a short-channel effect. However, since the gate electrode 63 is adjacent to the source/drain regions 62 through the thin gate insulating film 3, a large gate/drain parasitic capacitance is formed to disadvantageously degrade the high frequency performance of the MISFET.

As described above, in a conventional MISFET in a deep submicron region, when the source/drain regions are to be made shallow to suppress the short-channel effect, a high-concentration impurity diffusion layer required to reduce a series resistance cannot be obtained. In addition, the source/drain regions are to be made effectively shallow by using the elevated source/drain structure, high-temperature heat treatment processing such as a silicon epitaxial processing step is required, and a gate-drain parasitic capacitance is excessively large in the UMOS structure to disadvantageously degrade the high frequency performance.

BRIEF SUMMARY OF THE INVENTION

The present invention has been made to solve the above problems, and has as its object to realize a new MISFET structure which can suppress a short-channel effect in a deep submicron region without additional high temperature processing and has excellent high frequency performance.

A semiconductor device and a method of manufacturing the same according to the present invention provide the structure of a high performance MISFET which has source/drain regions having a diffusion layer depth being sufficient to prevent generation of a leakage current at a drain junction in a SALICIDE process and which suppresses a short-channel effect and a method of manufacturing the structure. It is another object to provide the structure of a high performance MISFET having performance being more excellent than that of an elevated source/drain structure and a method of manufacturing the structure.

More specifically, there is provided a semiconductor device having a MIS-type field effect transistor comprising a concave formed in at least a semiconductor substrate, a channel region formed on a bottom surface of the concave, source/drain extension regions connected to both ends of the channel region and formed on the bottom surface of the concave, and source/drain regions being close to or adjacent to side surfaces of the concave, formed along a surface of the semiconductor substrate in a direction of depth, and connected to the source/drain extension regions, wherein side surfaces of the concave on a source/drain side constitute a rounded surface.

Preferably, the concave is constituted by a trench formed from the surface of the semiconductor substrate in the direction of depth.

According to the present invention, there is provided a semiconductor device having a MIS-type field effect transistor comprising a concave constituted by a trench formed in a semiconductor substrate, a channel region formed on a bottom surface of the concave, source/drain extension regions connected to both ends of the channel region and formed on the bottom surface of the concave, and source/drain regions formed on a surface of the semiconductor substrate being close to or adjacent to side surfaces of the concave and connected to the source/drain extension regions.

Preferably, a position where an impurity concentration of the source/drain regions in the direction of depth is maximum almost coincides with a position where an impurity concentration of the source/drain extension regions in the direction of depth is maximum at a connecting portion.

More preferably, a taper angle set to upwardly increase the opening portion is given to the concave.

More preferably, the concave comprises a gate formed on the bottom surface of the concave through a gate insulating film, and gate sidewall spacers consisting of an insulator formed on side surfaces of the gate, and the gate sidewall spacers are formed to partially cover the side surfaces of the concave extending on at least the source/drain side of the gate.

More preferably, the gate sidewall spacers are formed to entirely cover the side surfaces of the concave extending on at least the source/drain side of the gate.

More preferably, ion implantation for threshold voltage control of the MIS-type field effect transistor is performed to only the bottom surface of the concave.

According to the present invention, there is provided a method of manufacturing a semiconductor device comprising the steps of forming an etching mask constituted by a first insulating film having an opening portion including a gate forming portion and source/drain extension regions forming portion on a semiconductor substrate, forming a trench in the semiconductor substrate in correspondence with the opening portion of the etching mask, forming a gate insulating film constituted by a second insulating film on an inner surface of the trench, forming a gate material film on the second insulating film, patterning the gate material film to form a gate on a central portion between both sides of the trench on a source/drain side through the second insulating film, implanting impurity ions into at least a bottom surface of the trench by using the gate as a mask to form source/drain extension regions, forming a third insulating film to cover a surface of the semiconductor substrate subjected to the steps, forming gate sidewall spacers constituted by the third insulating film by using anisotropic etching to cover the inner surface of the trench extending on the source/drain side of the gate, and implanting impurity ions into the source/drain regions by using the gate having the gate sidewall spacers as a mask to form a MIS-type field effect transistor having source/drain regions being close to or adjacent to side surfaces of the trench of the semiconductor substrate and connected to the source/drain extension regions on the bottom surface of the trench.

According to the present invention, there is provided a method of manufacturing a semiconductor device comprising the steps of forming an etching mask constituted by a first insulating film including a gate forming portion and source/drain extension regions forming portion and having an opening portion formed therein on a semiconductor substrate, forming a trench in the semiconductor substrate in correspondence with the opening portion of the etching mask, forming a gate insulating film constituted by a second insulating film on an inner surface of the trench, forming a gate material film to cover the surface of the semiconductor substrate subjected to the above steps, further forming a third insulating film on the gate material film, etching-back the upper surfaces of the third insulating film and the gate material film to form a gate forming etching mask constituted by the third insulating film buried in the gate material film on a central portion between both sides of the mask opening portion on the source/drain side, and anisotropically etching the gate material film by using the third insulating film buried in the gate material film as a mask to process the gate, thereby forming a MIS-type field effect transistor having a self-aligned gate formed on a central portion between both sides of the trench on the source/drain side.

Preferably, when a gate length of the MIS-type field effect transistor is represented by L, a length of the opening portion, in a direction of the gate length, of the opening portion of the etching mask constituted by the first insulating film is represented by $L_w$, and the thickness of the gate material film is represented by d, a relationship $L \leq L_w - 2d$ is satisfied.

According to the present invention, there is provided a method of manufacturing a semiconductor device comprising, forming an etching mask constituted by a first insulating film including a gate forming portion and source/drain extension regions forming portion and having an opening portion formed therein on a semiconductor substrate, forming a trench in the semiconductor substrate in correspondence with the opening portion of the etching mask, forming a gate insulating film constituted by a second insulating film on an inner surface of the trench, forming a third insulating film to cover the surface of the semiconductor substrate subjected to the above steps, forming sidewall spacers constituted by the third insulating film by using anisotropic etching on side surfaces of the mask opening on a source/drain side, forming a gate material film to cover the surface of the semiconductor substrate subjected to the above steps, etching-back the upper surfaces of the third insulating film and the gate material film to form a gate constituted by the gate material film buried between the sidewall spacers on a central portion between both sides of the mask opening portion on the source/drain side, and selectively removing the first and third insulating films to form a MIS-type field effect transistor having a self-aligned gate formed on a central portion between both sides of the trench on the source/drain side.

Preferably, the trench is formed by isotropic etching such that the side surfaces of the trench on the source/drain side constitute a rounded surface.

More preferably, ion implantation for threshold voltage control of the MIS-type field effect transistor is performed to only the bottom surface of the trench.

More preferably, the first, second, and third insulating films are an $SiO_2$ film formed by an LPCVD (low pressure chemical vapor deposition) method using TEOS (tetraethylorthosilicate), an $SiO_2$ film formed by thermal oxidation of silicon, acid an SiN film formed by a CVD method, respectively. The first insulating film is formed to be stacked on a thermal oxidation film formed as a buffer layer on the semiconductor substrate.

More preferably, according to the present invention, there is provided a method of manufacturing a semiconductor device further comprising the steps of implanting impurity ions into at least the bottom surface of the trench by using the self-aligned gate as a mask to form source/drain extension regions, forming a fourth insulating film to cover the surface of the semiconductor substrate subjected to the steps, forming gate sidewall spacers constituted by the fourth insulating film by using anisotropic etching to cover the inner surface of the trench extending on the source/drain side of the gate, and implanting impurity ions into the source/drain regions by using the gate having the gate sidewall spacers as a mask to form source/drain regions being close to or adjacent to side surfaces of the trench of the semiconductor substrate and connected to the source/drain extension regions on the bottom surface of the trench.

More preferably, there is provided a method of manufacturing a semiconductor device further comprising the step of, after a silicide film of high melting point metal is formed on a silicon surface exposed to the source/drain regions and upper surfaces of the gate consisting of polysilicon by forming a high melting point metal film to cover the surface of the semiconductor substrate and performing heat treatment, removing the high melting point metal film remaining on the gate sidewall spacers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A to 7I are sectional views showing the steps in a method of manufacturing a MISFET according to the second embodiment;

DETAILED DESCRIPTION OF THE INVENTION

Embodiments of the present invention will be described below with reference to the accompanying drawings.

Figure 4:
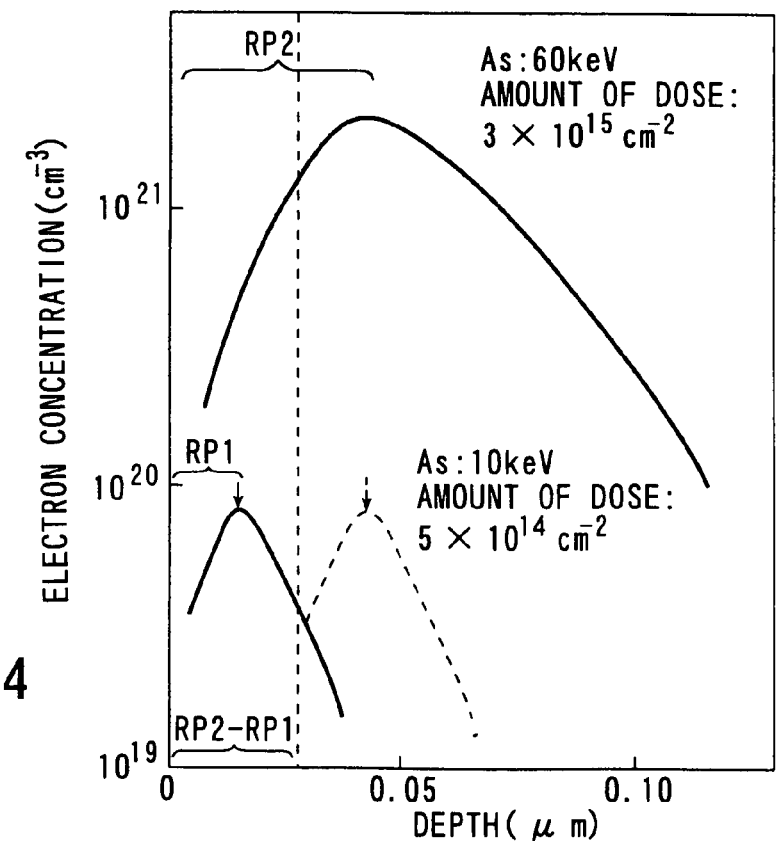
FIG. 4 is a graph showing a state for forming ion-implantation profiles of a semiconductor device according to the present invention in a silicon substrate in comparison with a conventional planar-type LDD structure.

FIG. 4 is a graph showing ion implantation profiles for forming impurity diffusion layers in source/drain regions and extension regions of MISFETs according to all the embodiments of the present invention.

As shown in the lower portion of FIG. 4, shallow ion implantation into the extension region of an n-channel MISFET by using a polysilicon gate as a mask in a deep submicron region is performed under the following implantation conditions. For example, As ions are implanted at an acceleration voltage of 10 keV and a dose amount of about $5 \times 10^{14}$ cm$^{-2}$.

The implanted As ions loss acceleration energy at an implantation depth $R_{P1}$ from the silicon substrate surface which is mainly determined by the acceleration voltage. For this reason, after heat treatment for As ion activation of implanted As ions, an extension region constituted by a shallow impurity diffusion layer having an electron concentration at the depth $R_{P1}$ which has a peak value of about $1 \times 10^{20}$ cm$^{-3}$ and an error function complement type electron concentration profile can be obtained. Here, the activation of As ions means a state wherein electrons can be supplied by using As ions as donors.

Gate sidewall spacers are formed on the side surfaces of the polysilicon gate by using a silicon nitride film or the like, and deep ion implantation of donor impurity such as As is performed by using the polysilicon gate having gate sidewall spacers as a mask, so that impurity diffusion layers in source/drain regions are formed. The ion implantation conditions of As at this time are an acceleration voltage of 60 keV and a dose amount of about $3 \times 10^{15}$ cm$^{-2}$.

When the acceleration voltage and the dose amount are increased, a junction depth increases. For this reason, after heat treatment for activation of implanted As ions is performed, a deep impurity diffusion layer having an error function complement type electron concentration profile having an electron concentration of $1 \times 10^{21}$ cm$^{-3}$ can be obtained.

Figure 1:
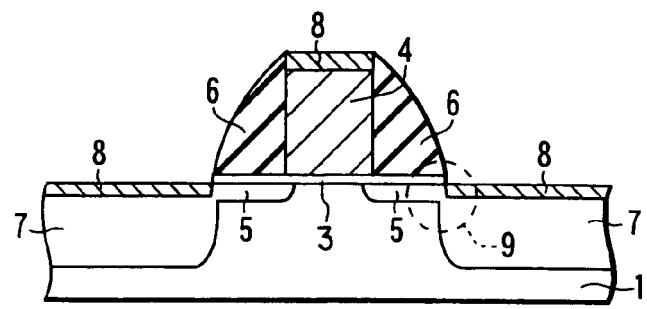
FIG. 1 is a sectional view of a conventional planar-type LDD MISFET.

Under these conditions, when the conventional LDD structure described by using FIG. 1 is formed, a step of $R_{P2} - R_{P1}$ is generated between a peak position $R_{P1}$ of an electron concentration in the depth direction of extension regions 5 and a peak position $R_{P2}$ of an electron concentration of source/drain regions 7. More specifically, as shown in FIG. 4, the source/drain regions 7 are connected to the extension regions 5 at portions which are located on the surface sides of the depth $R_{P2}$ and have considerably low electron concentrations.

For this reason, even if the peak value of the electron concentration of the source/drain regions 7 is made sufficiently high, since an impurity concentration at the connection portion considerably decrease, a series resistance between the source and the drain increases, which results in the degradation of the operation speed of the MISFET. In order to avoid this problem, as described by using FIG. 1, a high conductance silicide layer 8 is formed from the surfaces of the impurity diffusion layers of the source/drain regions 7 to a position having a predetermined depth by silicidation, and a SALICIDE structure compensating for the decrease in impurity concentration is formed as an effective countermeasure.

However, as shown in FIG. 4, when the impurity concentration decrease on the surfaces of the source/ drain diffusion layers must be avoided by the SALICIDE structure. Therefore, silicidation must be advanced to almost $R_{P2}$. At this time, as indicated by the broken-line circle in FIG. 1, the end portion of the silicide film containing a large number of lattice defects is close to the source/drain junctions, and a leakage current is generated by a drain junction to which a high reverse voltage is applied in an operation of the MISFET.

The structure of an n-channel MISFET according to the first embodiment of the present invention will be described below by using FIG. 4 and FIG. 5. The MISFET according to the present invention shown in FIG. 5 comprises a shallow concave 2 having a depth of about $R_{P2} - R_{P1}$ in a semiconductor substrate 1, a polysilicon gate 4 is formed on the central portion between both the sides of the source and the drain of the shallow concave 2 through a gate oxide film 3. In this MISFET, shallow extension regions 5 formed by using the polysilicon gate 4 as a mask and gate sidewall spacers 6 constituted by silicon nitride films are formed to cause the gate sidewall spacers 6 to just cover the inner surface of the shallow concave 2, and deep source/drain regions 7 formed by using the gate sidewall spacers 6 as masks are formed.

The LDD structure MISFET according to the first embodiment of the present invention further comprises a silicide film 8 formed on the upper surface of the source/drain regions 7 and the polysilicon gate 4 to improve the high speed performance of the MISFET.

Figure 5:
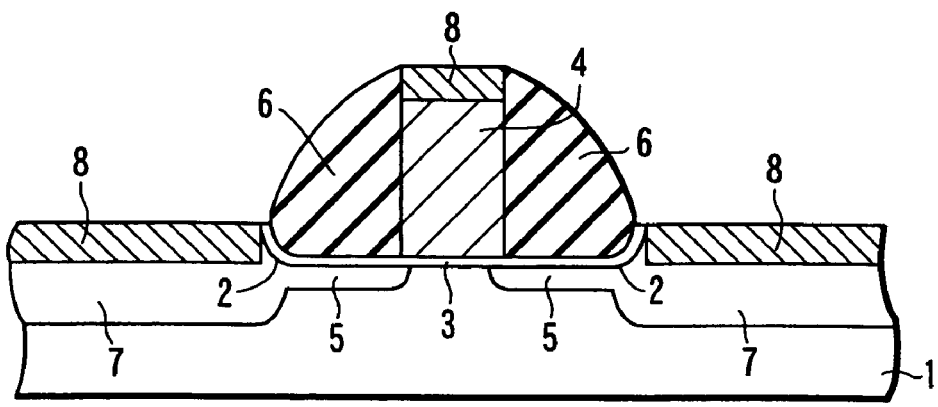
FIG. 5 is a view showing the sectional structure of a MISFET according to the first embodiment.

As shown in FIG. 5, when an LDD structure is formed on the MISFET having the shallow concave 2 having a depth of about $R_{P2} - R_{P1}$ by using ion implantation, as indicated by a broken line in FIG. 4, the electron concentration profiles of the shallow diffusion layers of the extension regions 5 are shifted from the electron concentration profiles of the deep diffusion layers of the source/drain regions by $R_{P2} - R_{P1}$ in the depth direction, and the position of a peak concentration indicated by a broken-line arrow can almost coincide with the position of the peak concentration of the deep diffusion layers of the source/drain regions. An allowable range of $R_{P2} - R_{P1}$ required to make the positions of the peak concentrations almost coincide with each other is about ±0.01 µm with respect to conditions for perfect coincidence.

In this manner, at portions where the electron concentrations of the source/drain regions 7 at the depth $R_{P2}$ are maximum, the extension regions 5 are connected to the source/drain regions 7. For this reason, the series resistance between the source and the drain is lower than that of a conventional LDD structure, and the operation speed of the MISFET can be improved.

In order to further improve the operation speed of the MISFET according to the present invention, when the silicide film 8 is formed on the source/drain regions as shown in FIG. 5, a merit of the MISFET according to the present invention having the shallow concave 2 will be further described below.

As is apparent from the sectional structure shown in FIG. 5, when the shallow concave 2 exists, if silicidation is advanced to $R_{P2}$, the end portion of the silicide film 8 containing a large number of lattice defects is not very close to they source/drain junctions, and a leakage current of the drain junction to which a high reverse voltage is applied in the operation of MISFET can be completely avoided from being increased.

As described above, when the silicide film 8 having a high conductance reaches a position where the electron concentrations of the source/drain regions 7 are maximum, and the extension regions 5 are connected to the source/drain regions 7 at a position where the electron concentrations are maximum, the series resistance between the source and the drain is made considerably lower than that of a conventional SALICIDE structure, and the value of the leakage current of the drain junction can be decreased to a negligible value. In this manner, the operation speed of the MISFET can be improved, and a semiconductor device having a high manufacturing yield and high reliability can be obtained.

The dimensions of the respective parts of an n-channel MISFET in the first embodiment of the present invention is illustrated as follows. More specifically, the depth of the shallow concave 2 is 0.04 μm to 0.05 μm, the width of the shallow concave 2 between the source and the drain in the channel length direction is 0.3 μm, the length of the polysilicon gate 4 is 0.1 μm, the height of the polysilicon gate 4 is 0.2 μm, a junction depth from the bottom surface of the shallow concave 2 in the extension regions 5 is 0.04 μm, and the junction depth of the source/drain regions 7 from the surface of the semiconductor substrate is 0.15 μm.

In the ion implantation shown in FIG. 4, the value $R_{P2}-R_{P1}$ corresponding to the depth of the shallow concave is about 0.025 μgm. For this reason, in order to make the depth of the shallow concave 0.04 μm to 0.05 μm, deep implantation of As ions into the source/drain regions 7 must be performed by using an acceleration voltage and a dose amount which are larger than the values shown in FIG. 4. In this manner, it is one characteristic feature that the peak concentration of the source/drain regions 7 and the depth of the source/drain junctions can be increased depending on the depth of the shallow concave 2 without increasing a short-channel effect.

In the same manner as an n-type MISFET case, a p-channel MISFET having the shallow concave 2 according to the present invention can be obtained by ion implantation of a p-type impurity. At this time, shallow ion implantation into p-type extension regions is performed under the following conditions. For example, Ge ions are implanted at an acceleration voltage of 10 keV and a dose amount of $5 \times 10^{14}$ cm$^{-2}$, the silicon substrate surface is pre-amorphized, and $BF_2$ ions are implanted at an acceleration voltage of 7 keV and a dose amount of $5 \times 10^{14}$ cm$^{-2}$.

Deep ion implantation into p-type source/drain regions is performed under the following conditions. For example, B ions are implanted at an acceleration voltage of 7 keV and a dose amount of $3 \times 10^{15}$ cm$^{-2}$, or $BF_2$ ions are implanted at an acceleration voltage of 35 keV and a dose amount of $3 \times 10^{15}$ cm$^{-2}$.

As shown in FIG. 5, in the MISFET having the shallow concave 2 according to the present invention, most preferably, the gate sidewall spacers 6 are formed to just cover the inner surface of the shallow concave 2 for the following reason.

Figure 6A:
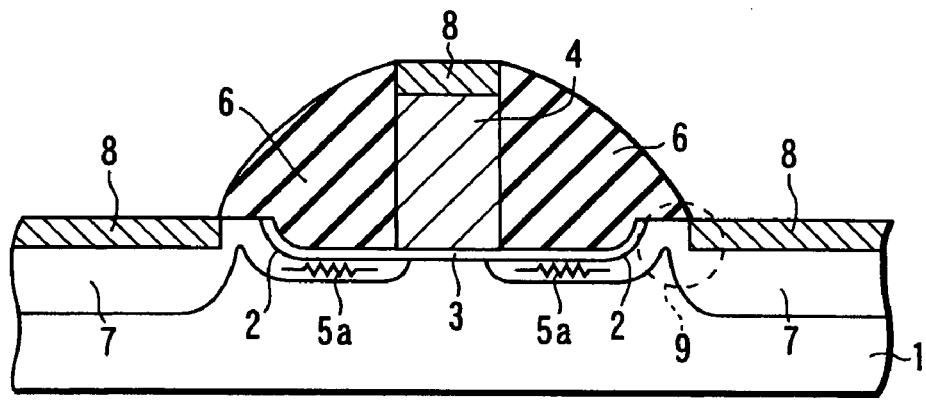
FIG. 6A is a sectional view showing a problem occurring when gate sidewall spacers partially cover the upper surface of the semiconductor substrate over a shallow concave in the MISFET according to the first embodiment.

When the gate sidewall spacers 6 are excessively large to partially cover the upper surface of a peripheral silicon substrate over the inner surface of the shallow concave 2, extension regions 5a using the polysilicon gate 4 as a mask has a shape shown in FIG. 6A. As described above, when the effective lengths of the extension regions are larger than a designed length, parasitic resistances are generated in the extension regions to hinder the high speed performance of the MISFET.

For this reason, as ideally described above, the gate sidewall spacers 6 constituted by a silicon nitride film or the like must be formed on the polysilicon gate 4 to just cover the inner surface of the shallow concave 2.

However, in fact, the impurity implanted into the source/drain regions 7 by using the gate sidewall spacers 6 as masks is subjected to lateral diffusion of about 0.05 μm in a heat treatment process for activation. For this reason, even if the gate sidewall spacers 6 are excessively thick to partially cover the upper surface of the silicon substrate around the shallow concave by about the lateral diffusion length, an anomalous-shaped portion indicated by a broken-line circle 9 in FIG. 6A is eliminated by the lateral diffusion of the source/drain regions, and the problem caused by the parasitic resistances 5a can be avoided.

Figure 6B:
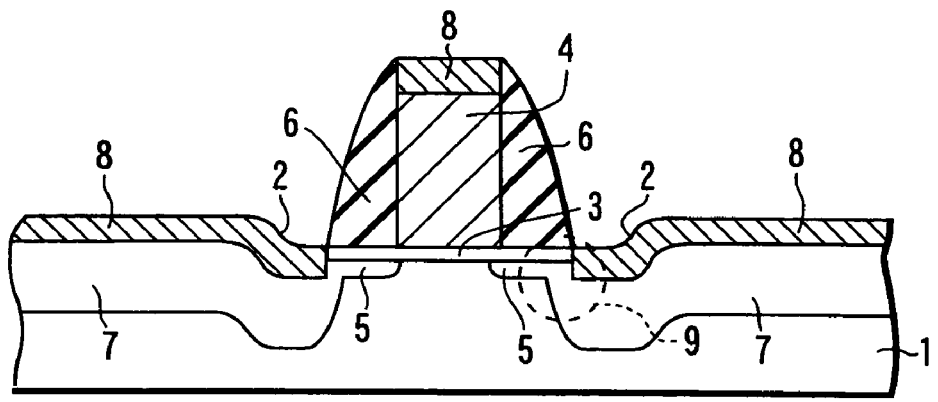
FIG. 6B is a sectional view showing a problem occurring when the gate sidewall spacers partially cover the inner surface of the shallow concave in the MISFET according to the first embodiment.

As shown in FIG. 6B, when the bottom surface of the shallow concave 2 is partially exposed because the gate sidewall spacers 6 are small, the extension regions 5 and the source/drain regions 7 are formed by ion implantation into the bottom surface of the concave. For this reason, the same problem occurring in the conventional structure described in FIG. 1 is posed at the connection portion.

More specifically, the following problems are posed. That is, a step of peak concentrations is generated at the connection portion to increase the series resistance of the connection portion, and the distance between the deep source/drain regions is smaller than the designed value, thereby increasing a short-channel effect. In addition, when the SALICIDE structure is used, the silicide film 8 is close to the source/drain junctions to cause drain junction leak. However, in this case, when the gate sidewall spacers 6 are formed to reach at least the lower side surface of the shallow concave, these problems are considerably moderated.

Therefore, it is important that the inner surface of the shallow concave 2 is just covered with the gate sidewall spacers 6 not only to improve the reliability of the semiconductor device but also to optimize the performance of the semiconductor device. The SALICIDE structure in which the leakage current of the drain junction is extremely small can be obtained at a high yield. For this reason, a semiconductor device constituted by a CMOS circuit having low power dissipation, excellent high-sped performance, and a high integration level can be provided.

The MISFET having the shallow concave 2 according to the present invention has the following characteristic feature. That is, a gate-drain parasitic capacitance related to high speed performance is smaller than that of an elevated source/drain structure using silicon epitaxial growth.

Figure 2:
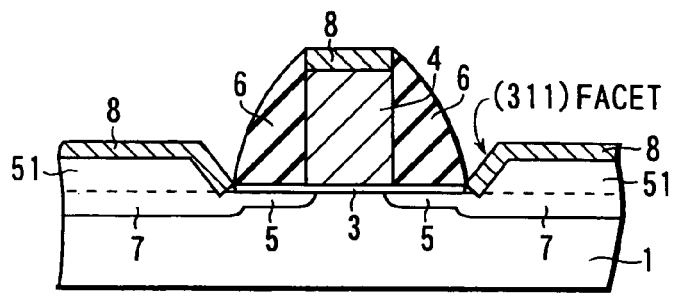
FIG. 2 is a sectional view of a conventional elevated source/drain MISFET.
Figure 3:
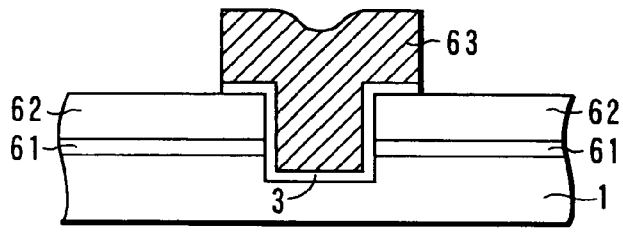
FIG. 3 is a sectional view showing the structure of a conventional UMOSFET.

As described in FIG. 2, in the elevated source/drain structure, (311) facets are formed at portions where the bottom portions of the gate sidewall spacers 6 are connected to the silicon epitaxial layers 51 on the source/drain regions 7 to planarly oppose the side surfaces of the polysilicon gate 4. When the silicide films 8 are formed, the entire surfaces of the source/drain regions 7 have equipotential. For this reason, a signal voltage is directly applied across the polysilicon gate 4 and the (311) facets to generate a large gate/drain parasitic capacitance.

However, in the MISFET having the shallow concave 2 according to the present invention, the silicide film 8 opposes the polysilicon gate 4 as surfaces being at right angles, and the side surface of the concave 2 is formed to have a rounded surface, so that the side surface of the concave 2 is far away from the side surface of the polysilicon gate 4. For this reason, the gate-drain parasitic capacitance can be minimized.

Figure 7A:
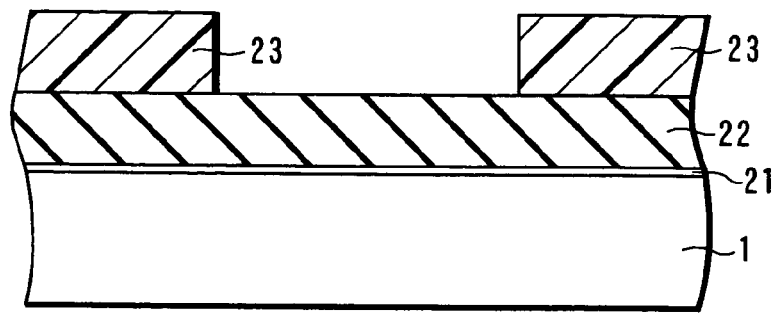

A method of manufacturing a semiconductor device according to the second embodiment of the present invention will be described below by using FIGS. 7A to 7I. As shown in FIG. 7A, a thermal oxide film 21 consisting of thin $SiO_2$ is formed on a semiconductor substrate 1 as a buffer layer, and an oxide film 22 consisting of $SiO_2$ is deposited by LPCVD using TEOS as a material.

Figure 7B:
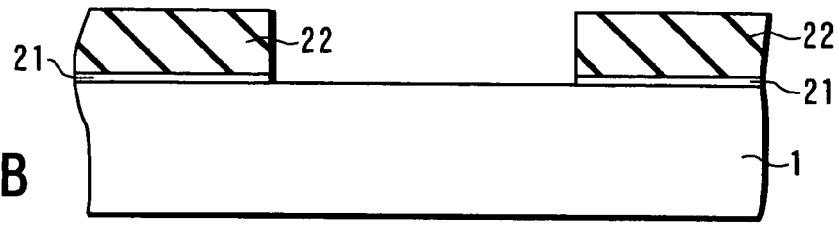

A mask pattern in which a region for a shallow concave 2 is opened is formed by using a resist film 23. An opening portion is performed in the oxide films 21 and 22 by reactive ion etching (to be referred to as RIE hereinafter) using the mask pattern as shown in FIG. 7B to expose the surface of the semiconductor substrate 1.

Figure 7C:
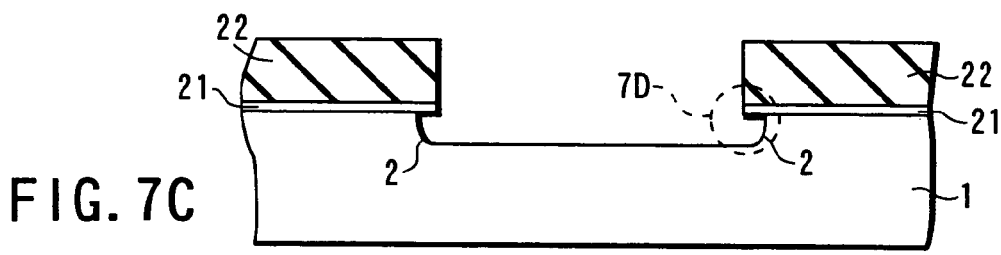

As shown in FIG. 7C, the exposed surface of the semiconductor substrate 1 is etched by using the oxide films 21 and 22 as etching masks. This etching is performed by using chemical dry etching (to be referred to as CDE hereinafter) for isotopic etching the silicon substrate. The CDE is chemical dry etching which is performed by using plasma activated ions without voltage acceleration.

Unlike the RIE, the CDE has less damage by ion irradiation onto the silicon substrate and is performed by isotropic etching. By using the facts, as shown in FIG. 7C, the side surface and the bottom surface of the shallow concave 2 can be formed by the CDE to have a rounded surface. When the silicon substrate surface exposed to the inside of the shallow concave 2 is damaged by high energy ion irradiation, the characteristics of the channel region and the gate oxide film formed on the silicon substrate surface are adversely affected to degrade the performance of the MISFET.

Figure 7D:
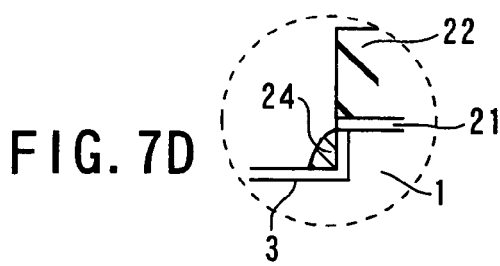

As shown in a broken-line circle in FIG. 7D, if the side surface of the shallow concave 2 of the semiconductor substrate 1 is formed vertical to the bottom surface by using anisotropic etching such as RIE, when a polysilicon gate is form at the center of the concave in a channel direction by using the RIE after the gate oxide film 3 is formed, a residue of polysilicon by RIE is easily generated at the corner portion of the concave as indicated by 24 in FIG. 7D. The residue may hinder the subsequent processing steps.

The depth of the shallow concave 2 formed in the silicon substrate, as described above, depends on the ion implantation conditions in formation of the deep diffusion layers of the source/drain regions 7. However, if the depth is greater than a half the height of the polysilicon gate 4, a gate-drain parasitic capacitance disadvantageously increases.

A resist film (not shown) in which the same opening portion as described above is formed is stacked on the oxide film 22 used as an etching mask in the step in FIG. 7C. By using the resist film as an ion implantation mask, ion implantation for controlling the threshold value of the MISFET can be selectively performed for only the bottom surface of the concave 2. In this manner, since an impurity concentration in wells immediately below the impurity diffusion layers of the source/drain regions can be decreased, the parasitic capacitance can be advantageously reduced.

In the prior art, in order to perform selective ion implantation into the channel region, a method of precisely controlling misalignment by using mask alignment and performing selective ion implantation into the channel region is employed. However, for this purpose, an expensive stepper requiring a large number of processing steps must be used. Therefore, the stepper causes costs to be high.

In the method of manufacturing a MISFET according to the present invention, it is possible to perform ion implantation to the channel region in self-aligned manner by using a mask material to form the shallow concave 2, thereby the mask alignment step is eliminated. Even when a plurality of ion implantation and a plurality of mask alignment therefore are required, the alignment process comparatively of low accuracy can be used, and the number of alignment process steps and a frequency of use of an expensive stepper advantageously decrease.

Figure 7E:
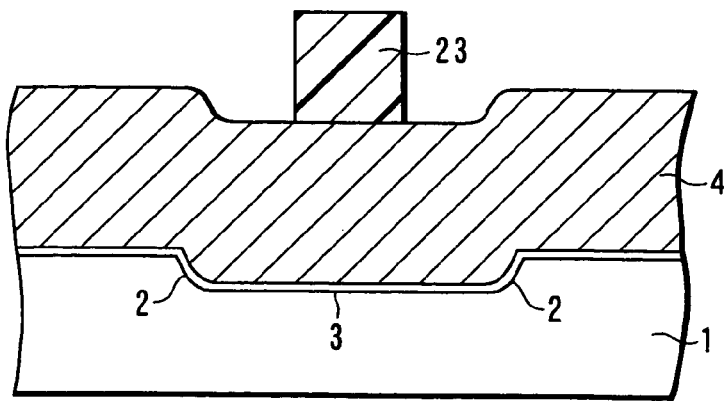

As shown in FIG. 7E, after the oxide films 21 and 22 used as masks are removed by ammonium fluoride or the like, a gate oxide film 3 consisting of $SiO_2$ is formed by thermal oxidation, a polysilicon film 4 serving as a gate electrode material is formed on the gate oxide film 3, and patterning for the polysilicon film is performed by using the resist film 23.

As shown in FIG. 7F, the polysilicon gate 4 is formed by using RIE, ion implantation is performed to the extension regions 5 by using the polysilicon gate 4 as a mask, and a silicon nitride film consisting of $Si_3N_4$ and having a thickness of about 0.1 μm is deposited to form the gate sidewall spacers 6. Subsequently, when the silicon nitride film is anisotropically etched by using RIE, a gate electrode constituted by the gate sidewall spacers 6 and the polysilicon gate 4 is formed to just cover the inner surface of the shallow concave 2.

As shown in FIG. 7G, the source/drain regions 7 is formed by ion implantation using the polysilicon gate 4 having the gate sidewall spacers 6 as a mask. At this time, the ion-implantation conditions are optimized such that no step is generated between the peak of the electron concentration of the extension regions 5 and the peak of the electron concentration of the source/drain regions 7.

A heat treatment process for activating the ion-implanted impurity is performed by rapid thermal annealing (to be referred to as RTA hereinafter) to prevent electron concentration profiles from being shifted by thermal diffusion. The conditions of the RTA are optimized at a temperature of 1,000° C. in the range of 20 sec or less.

As described above, the MISFET having the shallow concave 2 according to the present invention exhibits high speed performance which is more excellent than that of a conventional planar-type MISFET having no concave 2 up to the step shown in FIG. 7G. However, SALICIDE processing steps shown in FIG. 7H are introduced such that a source/drain series resistance and the resistance of the polysilicon gate are further reduced to improve high speed performance.

As shown in FIG. 7H, a film 25 consisting of, e.g., Ti which is one of a high melting point metal is deposited by a sputtering method on the entire surface of the silicon substrate subjected to the above processing steps, and the film 25 is subjected to heat treatment to cause silicidation to occur on the upper surfaces of the polysilicon gave 4 and the source/drain regions 7. As shown in FIG. 7I, a silicide film 8 consisting of $TiSi_2$ is formed.

The thickness of the silicide film 8 is determined depending on the thickness of the Ti film 25 and the heat treatment conditions. In the MISFET having the shallow concave 2 according to the present invention, the heat treatment conditions are determined such that a leakage current of the drain junction is for example, 0.5 fA/μm$^2$ when a gate-drain reverse voltage of 3V is applied. Unreacted Ti films 25 remaining on the gate sidewall spacers 6 are removed by etching using a mixture of $H_2SO_4$ and $H_2O_2$, so that the MISFET according to the present invention having the shallow concave 2 shown in FIG. 5 is completed.

In the SALICIDE processing steps, although Ti is used as a high melting point metal, a silicide film consisting of $CoSi_2$ can be formed by using Co in the same manner as described above. As heat treatment for accurately controlling silicidation, general two-step RTA may be used.

A method of manufacturing a semiconductor device according to the third embodiment of the present invention will be described below with reference to FIGS. 8A to 8D. In the method of manufacturing a MISFET according to the second embodiment, position alignment between the shallow concave 2 and the polysilicon gate 4 on the central portion of the shallow concave 2 in the channel direction is performed by mask alignment. However, in this method, displacement of about 1 µm may occur. If the displacement occurs, the problem described in FIGS. 6A and 6B may be posed on the source or drain side.

In order to avoid this problem, as the third embodiment, self-aligned processing in which the position of the polysilicon gate 4 is positioned at the center of the shallow concave 2 in the direction of the channel length will be described below.

Figure 8A:
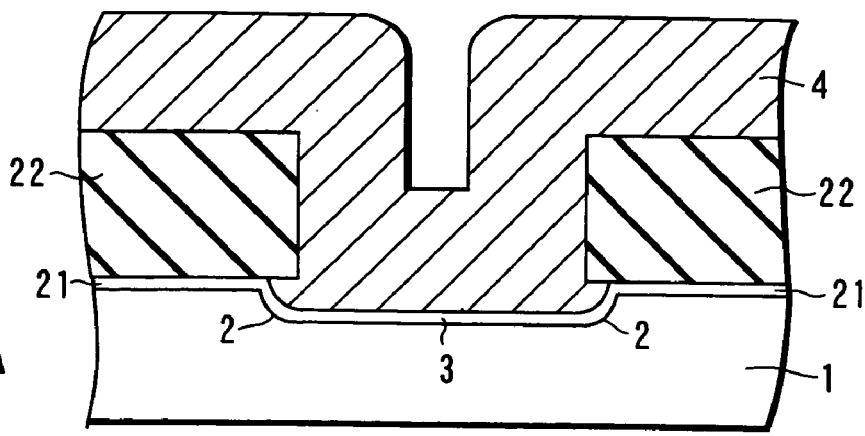
FIGS. 8A to 8D are sectional views showing the steps in a method of manufacturing a MISFET according to the third embodiment.

As shown in FIG. 8A, a buffer oxide film 21 and an oxide film 22 using TEOS are deposited on a silicon substrate, and an opening is formed in the buffer oxide film 21 and the oxide film 22. Thereafter, isotropic etching is performed to the resultant structure by CDE to form a shallow concave 2, ion implantation for controlling a threshold value is selectively performed by using the oxide film 22 as a mask. The steps up to this are the same as those described in FIGS. 7A to 7C.

A gate oxide film 3 is formed without removing the oxide film 22, and a polysilicon gate 4 is deposited. At this time, the width of the shallow concave 2 in the direction of the channel length and the thickness of the deposited polysilicon 4 satisfy the following relationship. That is, when the width of an opening portion of the mask for determining the width of the shallow concave 2 in the direction of the channel length is represented by $L_w$; the length of the polysilicon gate, L; and the thickness of the polysilicon, d, $L \leq L_w - 2d$ is satisfied. For example, when L=0.1 µm and $L_w$=0.3 µm, the deposition thickness of the polysilicon 4 is set to be about 0.1 µm.

Figure 8B:
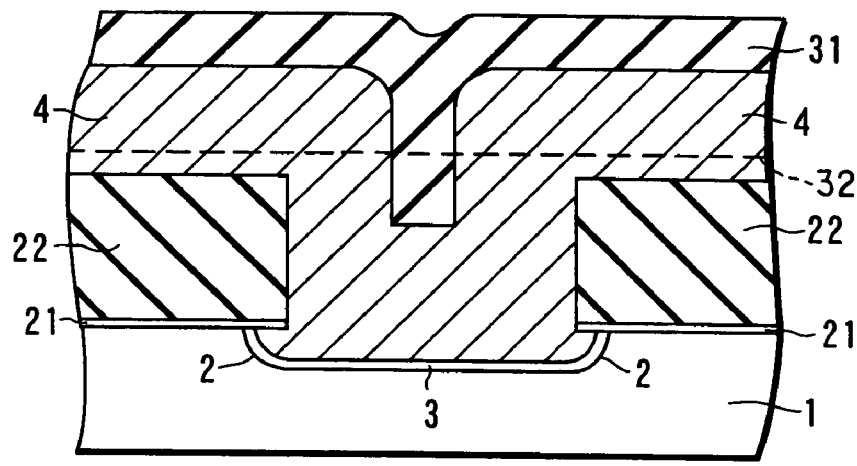
Figure 8C:
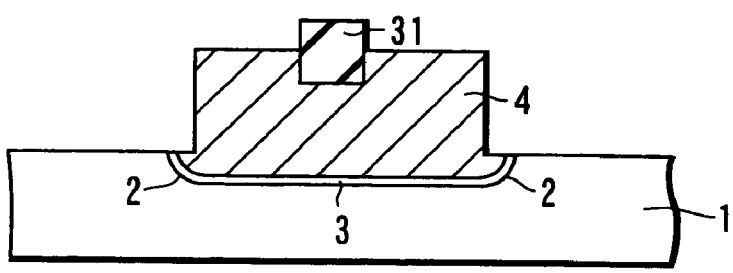

As shown in FIG. 8B, a silicon nitride film 31 is deposited on the polysilicon gate 4, and a portion above a broken line 32 is removed by Chemical Mechanical Polishing (to be referred to as CMP hereinafter). Thereafter, etching is performed by using the silicon nitride film 31 buried in the polysilicon gate 4 as a mask to expose the surface of the oxide film 22, and the oxide film 22 having the exposed surface is removed, so that a sectional structure shown in FIG. 8C is obtained.

Figure 8D:
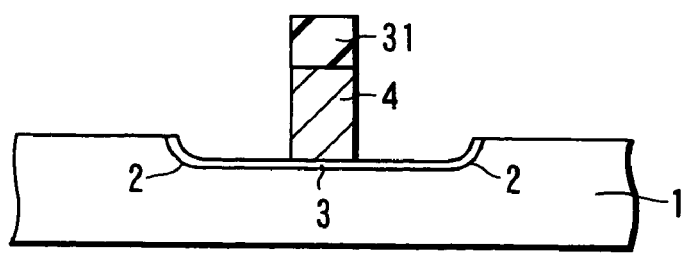

When the polysilicon gate 4 is subjected to anisotropic etching by RIE using the silicon nitride film 31 formed at the upper center of the shallow concave 2 through the polysilicon 4 as a mask, the polysilicon gate 4 is formed in a self-aligned manner on the central portion of the shallow concave 2 in the direction of the channel length, as shown in FIG. 8D.

When the steps described in FIGS. 7F and 7G are additionally performed to the silicon substrate subjected to the above steps, the MISFET according to the present invention having the shallow concave 2 obtained before the SALICIDE processing steps can be obtained. Unlike the step in FIG. 7G, the nitride film 31 formed by using the etching mask remains on the polysilicon gate 4. However, when the SALICIDE processing steps are further advanced, the steps described in FIGS. 7F to 7I may be performed after the silicon nitride film 31 is removed in the step in FIG. 8D.

As the manufacturing method described in the third embodiment, a method of forming the shortest polysilicon gate 4 in a self-aligned manner onto the shallow concave 2 on the silicon substrate. However, in a design for an integrated circuit, when a MISFET having a gate length which is partially large is required, a resist mask (not shown) is formed by mask alignment to cover the silicon nitride film 31 in the step in FIG. 8C, and anisotropic etching for the polysilicon gate 4 may be performed by RIE using the resist mask as a new mask.

At this time, a new problem of misalignment of the mask is posed. However, for a MISFET having a large gate length, the object of the present invention can be sufficiently achieved in the range of present mask alignment accuracy.

Figure 9A:
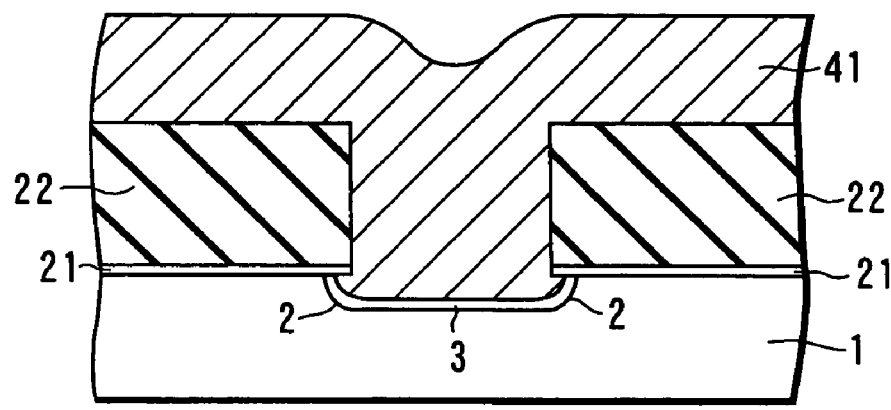
FIGS. 9A and 9B are sectional views showing the steps in a method of manufacturing a MISFET according to the fourth embodiment.
Figure 9B:
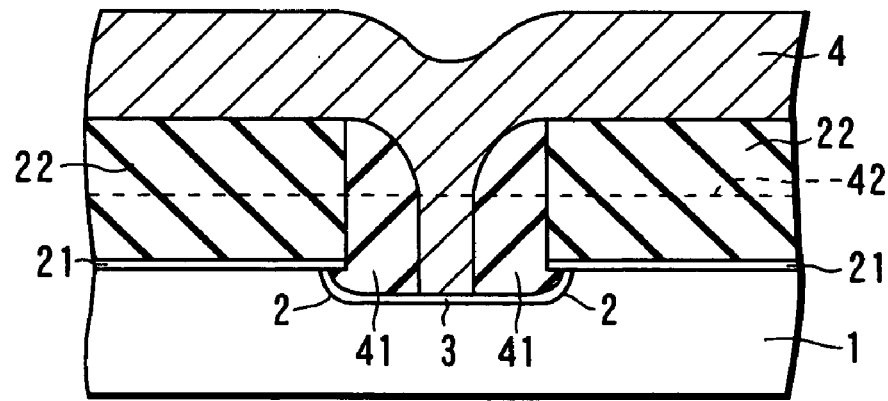

A method of manufacturing a semiconductor device according to the fourth embodiment of the present invention with reference to FIGS. 9A and 9B. As shown in FIG. 9A, a buffer oxide film 21 and an oxide film 22 using TEOS are deposited on a silicon substrate, and an opening is formed in the buffer oxide film 21 and the oxide film 22. Thereafter, isotropic etching is performed to the resultant structure by CDE to form a shallow concave 2, ion implantation for controlling a threshold value is selectively performed by using the oxide film 22 as a mask. The steps up to this are the same as those described in FIG. 7C.

A gate oxide film 3 is formed without removing the oxide film 22, and a silicon nitride film 41 is deposited. At this time, when the width of an opening portion of the mask in a channel direction of the shallow concave 2 is represented by $L_w$, a thickness d of the deposited nitride film 41 satisfies $2d \geq L_w$, so that the opening portion is completely buried with the nitride film 41.

The nitride film 41 is selectively and anisotropically etched by RIE to form sidewall spacers 41 on the side surfaces of the opening portion of the oxide film 22. A polysilicon film 4 is deposited on the entire surface of the resultant structure, and a portion above a broken line 42 is removed by CMP such that lower regions, of the sidewall spacers 41, in which the side surfaces of the sidewall spacers 41 are almost vertical to the bottom surface of the shallow concave 2 are left. Thereafter, when the sidewall spacers 41 and the oxide films 21 and 22 are removed, a polysilicon gate 4 from which the upper silicon nitride film 31 is removed in FIG. 8D is formed in a self-aligned manner on the central portion of the shallow concave 2 in the direction of the channel length.

When the steps described in FIGS. 7F and 7G are additionally performed to the silicon substrate subjected to the above steps, the MISFET according to the present invention having the shallow concave 2 obtained before the SALICIDE processing steps can be obtained. When the SALICIDE processing steps are further advanced, the steps described in FIGS. 7F to 7I may be added.

The present invention is not limited to the above embodiments. For example, in the present invention, a polysilicon film is used as a gate material of the MISFET, and a silicon nitride film is used as a sidewall portion. However, for the same purpose, a gate material except for polysilicon can be used, and an oxide film or another insulating film can be used as a sidewall spacer. In addition, although As is used as an n-type impurity for ion implantation, P having a large ion implantation depth can also be used as a donor impurity in the structure of the present invention.

If P is used, P is also deeply implanted into a polysilicon gate. A problem about gate depletion, which is posed in a deep submicron MISFET can be avoided. The gate depletion is a phenomenon in which a depletion layer is also formed on a gate electrode side because the carrier concentration of the gate electrode is low.

It is one of important means of the present invention that ion implantation of As is performed to form a shallow extension regions, and ion implantation of P is performed to form deep source/drain regions.

A case wherein silicon is used as the material of a substrate has been described above. However, the substrate is not limited to a silicon substrate, and the MISFET structure according to the present invention can be similarly used in a case wherein a high-speed MISFET is generally formed on a semiconductor substrate.

In the above description, although the concave of the present invention is formed below the semiconductor substrate surface by etching the semiconductor substrate, a concave is not limited to the concave described above. The concave described in each of the above embodiments is a trench having an arbitrary sectional shape, the same object as described above can be achieved.

By a method of forming an epitaxial layer having a high impurity concentration in source/drain forming regions on a semiconductor substrate, a gate forming region and source drain extension regions may be formed to be depressed with respect to an epitaxial layer surface. At this time, the semiconductor substrate surface constituting the concave may be etched. The side surfaces of the concave may have taper angles which increase upwardly. Various modifications and changes of the present invention can be effected without departing from the spirit and scope of the invention.

As described above, the semiconductor device of the present invention and the method of manufacturing the same have the following advantages in comparison with various MISFET structure such as a conventional planar-type MISFET structure, an elevated source/drain MISFET structure, and an UMOS type MISFET structure.

(a) A shallow concave is formed in a gate electrode forming region of a silicon substrate, and a peak position of a carrier concentration in deep source/drain regions formed to be close to or adjacent to the outside of the concave and a peak position of a carrier concentration in shallow source/drain extension regions connected to a channel on the bottom surface of the concave are caused substantially to coincide with each other, so that a source/drain series resistance is reduced. In addition, a short-channel effect is considerably suppressed, and a gate-drain parasitic capacitance is small. For this reason, a high-performance semiconductor device which is excellent in a high speed operation can be obtained.

(b) In a conventional planar-type LDD structured MISFET, when SALICIDE steps are used, a leakage current is easily generated at, especially, a drain junction. However, in the MISFET according to the present invention having a shallow concave formed therein, even if a thick silicide film is formed on source/drain regions, a leakage current is not generated at the drain junction, and a semiconductor device having a high yield and high reliability can be provided.

(c) The present invention can be similarly applied to an n-channel MISFET and a p-channel MISFET, and high speed performance can be easily obtained by SALICIDE steps. For this reason, a semiconductor device constituted by a CMOS having a high integration level and high speed performance can be provided at a high yield.

(d) When self-aligned type manufacturing steps are used, a semiconductor device according to the present invention having a shallow concave in a deep submicron region can be provided at a high yield.

(e) Since the method of manufacturing a semiconductor device according to the present invention does not includes the selective epitaxial step of silicon used in an elevated source/drain type MISFET, a change in threshold value of the MISFET by high temperature heat treatment or an increase in parasitic resistance caused by the change of carrier concentration profiles do not occur, and a complex pre-process such as a process of removing an oxide film in a selective epitaxial growth step of silicon is not required.

(f) In a conventional UMOS having a deep concave formed in a channel region, since the surface orientation of silicon crystals constituting the inner surface of the concave cannot be identified, interface state density between a gate oxide film and a substrate surface increases, and the quality of the gate oxide film is lowered. However, in the structure of the present invention, the bottom surface of a shallow concave is constituted by (100) plane consisting of silicon, as in a conventional planar-type LDD structured MISFET having high performance, low interface state density and an excellent gate oxide film can be obtained. The structure of the present invention has an excellent characteristic feature that the value of a gate/drain parasitic capacitance which is considerably smaller than that of the UMOS can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming an etching mask comprising a first insulating film having an opening portion including a gate forming portion and source/drain extension regions forming portion on a surface of a semiconductor substrate;

forming a trench in the semiconductor substrate corresponding with the opening portion;

forming a gate insulating film comprising a second insulating film on an inner surface of the trench;

forming a third insulating film to cover a surface of the semiconductor substrate;

forming sidewall spacers comprising the third insulating film using anisotropic etching on side surfaces of the opening portion on source/drain sides respectively;

forming a gate material film to cover the surface of the semiconductor substrate;

etching-back the upper surfaces of the third insulating film and the gate material film to form a gate comprising the gate material film buried between the sidewall spacers on a central portion between both sides of the opening portion on the source/drain side;

selectively removing the first and third insulating films to form a MIS-type field effect transistor having a self-aligned gate formed on the central portion between both sides of the trench on the source/drain side, in which a position where an impurity concentration of highly-doped source/drain regions in the direction of depth is maximum substantially coincides with a position where an impurity concentration of the source/drain extension regions in the direction of depth is maximum;

implanting impurity ions into at least a bottom surface of the trench using the gate as a mask to form source/drain extension regions;

forming a fourth insulating film to cover the surface of the semiconductor substrate;

forming gate sidewall spacers comprising the fourth insulating film using anisotropic etching to cover an inner surface of the trench extending on the source/drain side of the gate; and implanting impurity ions by using the gate having the gate sidewall spacers as a mask to form the highly-doped source/drain regions substantially adjacent to side surfaces of the trench and connected to the source/drain extension regions on the bottom surface of the trench.

2. A method of manufacturing a semiconductor device according to claim 1, wherein the trench is formed by isotropic etching such that side surfaces of the trench on the source/drain side comprise rounded surfaces.

3. A method of manufacturing a semiconductor device according to claim 1, wherein ion implantation for threshold voltage control of the MIS-type field effect transistor is performed only to a bottom surface of the trench.

4. A method of manufacturing a semiconductor device according to claim 1, wherein the first, second, and third insulating films comprise a $SiO_2$ film formed by an LPCVD method using TEOS, a $SiO_2$ film formed by thermal oxidation of silicon, and a SiN film formed by a CVD method, respectively.

5. A method of manufacturing a semiconductor device according to claim 1, wherein the first insulating film overlays on a thermal oxidation film formed as a buffer layer on the semiconductor substrate.

6. A method of manufacturing a semiconductor device according to claim 1, further comprising:

forming a high melting point metal film to cover the surface of the semiconductor substrate and performing heat treatment; and removing the high melting point metal film on the gate sidewall spacers.

* * * * *